United States Patent
Arvin et al.

(10) Patent No.: US 6,838,009 B2
(45) Date of Patent: Jan. 4, 2005

(54) REWORK METHOD FOR FINISHING METALLURGY ON CHIP CARRIERS

(75) Inventors: Charles L. Arvin, South Bend, IN (US); Daniel G. Berger, New Paltz, NY (US); Hsichang Liu, Fishkill, NY (US); Krystyna W. Semkow, Poughquag, NY (US)

(73) Assignee: International Business Machines Corporation, Armonk, NY (US)

(*) Notice: Subject to any disclaimer, the term of this patent is extended or adjusted under 35 U.S.C. 154(b) by 247 days.

(21) Appl. No.: 10/016,009

(22) Filed: Oct. 30, 2001

(65) Prior Publication Data

US 2003/0080092 A1 May 1, 2003

(51) Int. Cl.[7] .......................... H01B 13/00; H01L 21/00
(52) U.S. Cl. ............................................. 216/21; 438/4
(58) Field of Search .............................. 216/13, 14, 16, 216/17, 21, 100, 105; 228/103, 119

(56) References Cited

U.S. PATENT DOCUMENTS

| | | |
|---|---|---|
| 4,007,037 A | 2/1977 | Lukes et al. |
| 4,502,924 A | 3/1985 | Minami et al. |
| 5,489,410 A | 2/1996 | Baumgartner et al. |
| 5,549,809 A | 8/1996 | Barreau et al. |
| 5,682,415 A | 10/1997 | O'Hara |
| 5,768,339 A | 6/1998 | O'Hara |
| 5,858,557 A | 1/1999 | Yoon et al. |
| 6,083,375 A | 7/2000 | Cheng et al. |
| 6,435,398 B2 * | 8/2002 | Hartfield et al. ............ 228/103 |

OTHER PUBLICATIONS

Wensink, H.; Bernschot, J.W.; Jansen, H.V.; Elwenspoek, M.C.; "High Resolution Powder Blast Micromachining"., Micro Electro Mechanical Systems, 2000. MEMS 2000. The Thirteenth Annual Intenational Conference on, Jan. 23–27, 2000, pp. :769–774.*

Perrin Walker; William H. Tarn, "CRC Handbook of Metal Etchants" p. 334. CRC Press LLC, 1991.*

* cited by examiner

Primary Examiner—Gregory Mills
Assistant Examiner—Robert Culbert
(74) Attorney, Agent, or Firm—DeLio & Peterson LLC; John J. Tomaszewski; Ira D. Blecker

(57) ABSTRACT

A method and apparatus are provided for reworking of finishing metallurgy on pads of electronic components. The pads are copper or copper/nickel and have a layer of nickel thereon and an overlying layer of gold. The gold layer is removed first followed by the nickel layer and then the component is treated to remove etch and corrosion products. Media blasting is then used to restore the pads to their original condition as on prime parts. The pads are then replated using conventional nickel and gold plating solutions to form the reworked component.

5 Claims, 1 Drawing Sheet

REWORK METHOD FOR FINISHING METALLURGY ON CHIP CARRIERS

BACKGROUND OF THE INVENTION

1. Field of the Invention

This invention relates generally to an electronic component wherein the electronic component contains pads and the components are joined together by solder and/or socket interconnections with other components and, more particularly, to the rework of such electronic component containing copper or copper/nickel pads having a layer of nickel and an overlying layer of gold by removing the gold and nickel layers on the pads and returning the pads to their original condition as on prime parts.

2. Description of Related Art

Forming an electronic package assembly whereby an electrical component such as an integrated circuit chip is electrically and mechanically connected to a substrate, a card, or board, another chip or another electronic part is well-known in the art. This technology is generally termed surface mount technology (SMT) and has gained acceptance as the preferred means of making electronic package assemblies. The interconnect technology is known as ball grid array packaging, C4 flip chip interconnect, multi-chip modules, multilayer and micro via printed wiring boards and surface mount hybrid assembly. In one particular application, to which this application is directed to for convenience, a multilayer glass-ceramic component is joined to a chip and/or an organic substrate. Such glass-ceramic component is to be reworked by removing defective metallization layers from the pads and returning them to their original condition.

Multilayer glass-ceramic electronic components are typically joined to other components by soldering pads on a surface of one of the electronic components to corresponding soldering pads on the surface of the other component. Control Collapse Chip Connection is an interconnect technology developed by IBM as an alternative to wirebonding. This technology is generally known as C4 technology or flip chip packaging. Broadly stated, an integrated circuit chip is mounted above a glass-ceramic substrate and pads on the chip are electrically and mechanically connected to corresponding pads on the substrate by a plurality of electrical connections such as solder bumps to form a module. A module is typically connected to other electronic components by solder or socket type connections.

In the C4 interconnect technology, a relatively small solder bump is attached to the pads on one of the components being joined, typically to the chip. The electrical and mechanical interconnects are then formed by positioning the corresponding pads on the glass-ceramic substrate to be joined adjacent the solder bumps on the chip and reflowing the bumps at an elevated temperature. The C4 joining process is self-aligning in that the wetting action of the solder will align the chip bump pattern to the corresponding pads on the glass-ceramic substrate.

A myriad of solder structures have been proposed for the surface mounting of one electronic component to another. Typical surface mount processes form the solder structures by screening solder paste on conductive, generally metallic pads exposed on the surface of a card or substrate. The solder paste is reflowed in an inert atmosphere and homogenizes the pad and brings the solder into a spherical shape. After alignment of corresponding pads the whole assembly goes through a reflow operation to form solder bonds. The interconnection made by joining components by an array of solder balls is termed a ball grid array (BGA). When the solder structure is in the form of a column, it is termed a column grid array (CGA). Land grid array (LGA) interconnection is used in socket type electronic assemblies.

Glass-ceramic substrates typically contain copper or copper/nickel pads which have a finishing metallurgy of a nickel layer on the copper pad followed by a gold layer which finishing metallurgy is required to produce solder wettable and socketable surfaces. Electroless plating of a nickel/phosphorous (NiP) layer followed by plating of a gold layer is typically used to make the finishing metallurgy. Since the plated layers may be defective it is necessary that the rework process restores the pads to their initial condition before the substrate can be replated and joined to another component.

Bearing in mind the problems and deficiencies of the prior art, it is therefore an object of the present invention to provide a method for reworking electronic components having copper or copper/nickel pads with nickel and gold layers to restore the pads to their original condition.

It is another object of the present invention to provide an apparatus for reworking electronic components having copper or copper/nickel pads with nickel and gold layers to restore the pads to their original condition.

It is yet another object of the present invention to provide an electronic component substrate and/or assembly reworked using the method and apparatus of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for reworking substrates with copper or copper/nickel pads containing a nickel layer and an overlying gold layer comprising the steps of:

supplying an electronic component such as a substrate having copper or copper/nickel pads thereon containing a nickel layer and an overlying gold layer;

etching the gold layer on the substrate pads preferably using a cyanide containing solution;

etching the nickel layer on the substrate pads preferably using an alkaline oxidizer containing solution having a pH greater than about 12.0;

treating the etched substrate to remove products formed during the etching steps and corrosion products preferably using a cyanide containing solution;

preferably restoring the copper or copper/nickel pad surface to its original condition preferably by media (e.g., particulate) blasting; and plating the restored copper surface with a nickel layer followed by a gold layer.

In a further aspect of the invention, an apparatus is provided for reworking substrates with copper or copper/nickel pads containing a nickel layer and an overlying gold layer comprising:

supplying means to supply an electronic component having copper or copper/nickel pads thereon containing a nickel layer and an overlying gold layer;

etching means to etch the gold layer on the substrate pads preferably using a cyanide containing solution;

etching means to etch the nickel layer on the substrate pads preferably using an alkaline oxidizer containing solution having a pH greater than about 12.0;

treating means to remove products formed during the etching steps and corrosion products from the etched substrate preferably using a cyanide containing solution;

preferably restoring means to restore the copper or copper/nickel pads to is original condition preferably by media (e.g., particulate) blasting; and plating means to plate the restored copper or copper/nickel pad surface with a nickel layer and an overlying gold layer.

In an additional aspect of the invention the copper or copper/nickel pads on chips and other electronic components may be reworked by removing nickel and gold layers on the pads and new nickel and gold layers plated on the copper or copper/nickel pads using the method and apparatus of the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
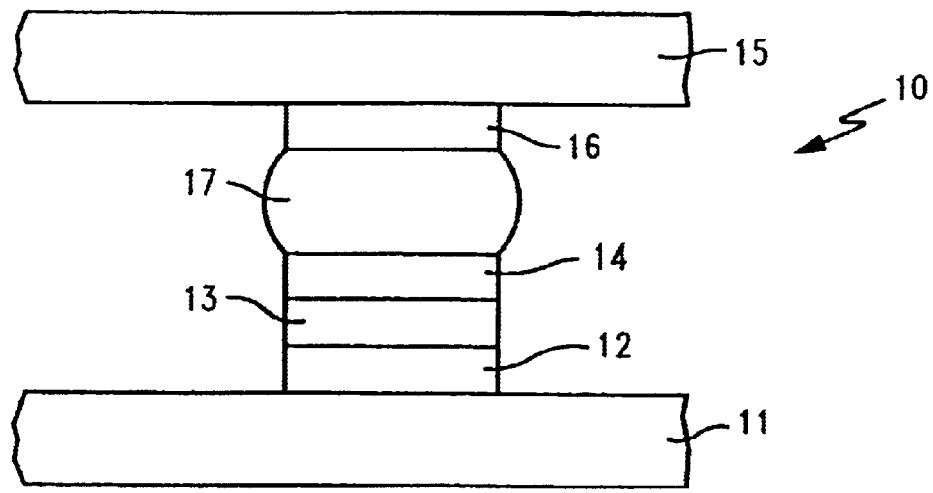
FIG. 1 is a schematic cross-sectional view of an electronic component assembly comprising a substrate having a chip attached thereto with a C4 solder ball interconnection between pads on the substrate and chip.

In describing the preferred embodiment of the present invention, reference will be made herein to FIGS. 1–2B of the drawings in which like numerals refer to like features of the invention. Features of the invention are not necessarily shown to scale in the drawings.

Referring to FIG. 1, an electronic component assembly of the prior art is shown generally as 10. The assembly comprises a substrate 11 having another electronic component 15 attached thereto by a solder ball 17 interconnection. The substrate 11 may be any suitable substrate and for convenience the following description will be directed to the substrate being a multilayer glass-ceramic. The ceramic substrate 11 has a copper pad 12 on the surface thereof with a nickel layer 13 and an overlying gold layer 14. A chip 15 is shown having a pad 16 on the bottom surface thereof. A solder ball interconnection 17 electrically and mechanically connects the chip 15 to the substrate 11.

The substrate 11 and chip 15 may be any electronic component that is well known in the art. For convenience the following description will be directed to the substrate being a multilayer glass-ceramic and the electronic component 15 attached thereto being a chip. Also, the solder interconnection 17 will be referred to as a solder ball (e.g., ball grid array (BGA)) although it will be appreciated by those skilled in the art that other solder interconnections such as columns (e.g., column grid array (CGA)), LGA and wirebond type may also be used for attaching the components.

Figure 2A:
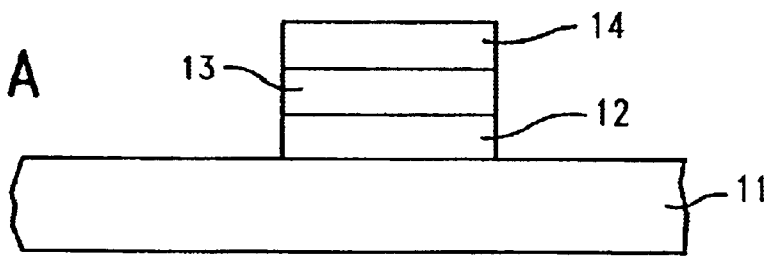
FIG. 2A is a schematic cross-sectional view of the substrate of FIG. 1 with finishing metallurgy on the pads.

Referring now to FIG. 2A, this figure shows a cross-sectional view of the electronic component assembly of FIG. 1 before the chip 15 and solder ball interconnection 17 are made with the substrate 11. FIG. 2A shows the substrate 11 having the copper pad 12, nickel layer 13 and overlying gold layer 14 thereon.

Figure 2B:
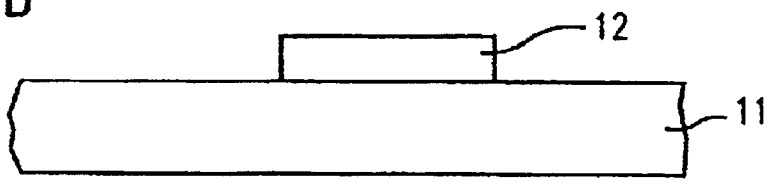
FIG. 2B is a schematic cross-sectional view showing the substrate of FIG. 2A with the layers of finishing metallurgy on the pads being removed.

The object of the invention is to provide a method to remove the gold layer 14 and nickel layer 13 from copper pad 12 of FIG. 2A to provide a reworked substrate 11 containing only a copper pad 12 as shown in FIG. 2B and which substrate 11 and pad 12 have not been detrimentally damaged. When the substrate 11 shown in FIG. 2B is obtained, a new nickel layer 13 and overlying gold layer 14 may be plated on the copper pad 12 by conventional means as is known in the art.

Regarding the copper pad 12 shown in FIG. 2A, copper is typically the material of choice for the pad because of its electrical properties. A combination copper/nickel pad may also be used, typically 10% nickel. Nickel is also preferred as a layer thereon because it serves as a barrier and provides strength. A wetting material such as gold is typically needed in an outermost metal film to which an electrical connection is made to produce a solder wettable and socketable surface.

The thickness of the various layers may vary widely, and in general, the thickness of a copper pad will be about 3 to 100 microns, preferably 5 to 50 microns. The nickel layer thickness is about 2 to 8 microns, preferably 2 to 5 microns and the gold layer is typically about 0.03 to 2 microns and preferably 0.03 to 1 micron.

The various layers may be formed on the substrate using any conventional means such as electroplating, electroless plating, sputtering, evaporation, and chemical vapor deposition. The nickel layer may be pure nickel but typically contains phosphorous in an amount up to about 12 wt. %.

In the method and apparatus of the invention, the first step is to etch the gold layer 14 from the nickel layer 13. It is important that the gold layer be removed first and then the nickel layer removed. It has been found that the gold layer and nickel layer cannot be removed simultaneously without detrimentally affecting the pads and/or substrate.

Any suitable gold etchant may be employed which does not attack the substrate 11 or pad 12 and a preferred etchant is COPKIA RIP Au-2 sold by Uyemura, Inc. COPKIA is an alkaline cyanide containing bath and the substrate 11 is immersed in the bath for a sufficient time at an effective temperature for removal of the gold layer. It is preferred that the etchant be used at room temperature (22–25° C.) and immersion of the substrate in the etchant for up to about 10 minutes, e.g., 1.5 to 3.5 minutes was found sufficient to remove the gold layer. It will be appreciated by those skilled in the art that thicker gold layers will require a longer etchant time and also that an elevated etchant temperature will generally reduce the etching time.

The next step of the method is to remove the nickel layer 13. It is highly preferred that the nickel etchant not attack the copper surface and etchant ENSTRIP EN-86 sold by Enthone-OMI, Inc. has been found to be effective and preferred. ENSTRIP EN-86 is an alkaline non-cyanide immersion stripper. To etch the nickel it is preferred that the etchant be used at an elevated temperature up to about 90° C., typically between 70 and 90° C., preferably 82–85° C. for a sufficient period of time up to about 1 hour, typically 15 minutes to 30 minutes. As with the gold etchant, thicker nickel layers will require longer etch times and higher etchant temperatures will generally require less time to etch the nickel 13 from the copper surface 12. The nickel can be etched immediately following the gold etch or later, up to a month or more, without any reactivation of the surface with the COPKIA or other gold etchant.

The etched substrate is now treated to remove products formed during the etching of the nickel layer. It is preferred to use a free cyanide containing solution, and a preferred cyanide solution contains up to about 10 g/l free cyanide or more, preferably in the form of potassium or sodium cyanide and preferably 15–20 g/l potassium cyanide. It is preferred to use the cyanide solution at room temperature of 20–25° C. although elevated temperatures can also be used. The immersion time is typically about 1 to 4 minutes at room temperature.

Other solutions can be used to remove the products formed during etching such as chromic acid at 30–60 g/l and a sodium hydroxide solution with a periodic reverse current. It is preferred however that a free cyanide containing solution be used to treat the etched products.

The next step in the process is to restore the copper or copper/nickel pad surface to its original state by preferably using a blasting step in which oxide and other small particulate matter is removed from the pad surface. A typical blasting device uses particulates or media such as alumina or silica at a pressure up to 50 psi or higher. It is also contemplated to use a chemical cleaner such as sodium or ammonium persulfate in a sulfuric acid solution. Specifically, a 40–80 g/l of sodium persulfate and 10% sulfuric acid at 25° C. for 1 minute has been found to provide good restoration results. Ammonium persulfate may be used at 80–120 g/l in 10% sulfuric acid at 25° C. for 1 minute.

After the restoration step, the copper pad is now in condition for plating to form the desired pad metallurgy which is typically a copper or copper/nickel pad having a layer of nickel preferably electroless nickel phosphorous (NiP) having about 6 to 10 weight % phosphorous and an overlying layer of gold.

Any plating procedures including the plating parameters used for the plating of the nickel and gold on the original pads may be used to replate the reworked substrate. A preferred replating process comprises electroless plating of a NiP layer containing 8–10 wt. % phosphorus with a thickness of about 2–5 microns followed by immersion plating of gold at a thickness of 0.03 to 0.13 micron. For land grid array or wirebond application a thicker gold layer typically up to 1.2 micron can be deposited by electroless plating.

A standard NiP electroless plating is performed at a pH of about 4.8 to 5.3 at 82–85° C. for 20 minutes. A standard immersion gold plating may be performed at a pH of 4.0–4.5 at 85° C. for 15 minutes. Electroless gold is typically deposited at a pH of about 13.0–14.0 at 60° C. for 40 minutes.

Various embodiments of the present invention will now be illustrated by reference to the following specific examples. It is to be understood, however, that such examples are presented for purposes of illustration only, and the present invention is in no way to be deemed as limited thereby.

EXAMPLE

A glass-ceramic substrate containing Cu/10% Ni C4 and BGA type pads with a 4 micron layer of NiP (8 wt % P) and a 0.08 micron layer of gold was treated as follows to restore the pads to substantially their original unplated condition.

The following steps were used:

1. Rinse in dionized water (DI) for 1 minute at room temperature.
2. Immerse in a COPKIA bath for 1.5 minutes at room temperature. The COPKIA bath contained about 18 g/l KCN, 3 g/l KOH, and 4 g/l sodium nitrobenzene sulfonate.
3. Rinse in DI water for 4 minutes at room temperature.
4. Immerse in ENSTRIP EN-86 for 20 minutes at 82° C.

The EN-86 contained, by weight, about 10% ethylenediamine, 2% NaOH, 1% sodium diethyldithiocarbamate and 6% nitrobenzene sulfonic acid. The pH of the EN-86 solution was about 13.0.

5. Rinse in DI water for 3 minutes at room temperature.
6. Immerse in a 20 g/l KCN solution for 2 minutes at room temperature.
7. Rinse in DI water for 4 minutes at room temperature.
8. Dry with $N_2$ or in a dryer.
9. Media blast at 30 psi with an alumina slurry for 1 minute.
10. Dry with $N_2$ or in a dryer.

The pads on the treated substrate were restored to substantially their original condition. The pads were then plated with a NiP (8 wt % P) layer and a gold layer and the pads and substrate were commercially acceptable.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:
What is claimed is:

1. An method for reworking an electronic component with copper or copper/nickel pads containing a nickel layer and an overlying gold layer comprising the steps of:

supplying an electronic component having copper or copper/nickel pads thereon containing a nickel layer and an overlying gold layer;

etching the gold layer on the component pads;

etching the nickel layer on the component pads;

treating the etched component to remove products formed during the etching steps and corrosion products with a solution selected from the group consisting of a free cyanide containing solution, chromic acid and a sodium hydroxide solution with a periodic reverse current; and planting the treated copper surface with a nickel layer followed by a gold layer.

2. The method of claim 1 wherein the pads on the treated component are restored to their original condition by media blasting.

3. The method of claim 2 wherein the gold layer is etched using a cyanide containing solution.

4. The method of claim 3 wherein the nickel layer is etched using an alkaline oxidizer containing solution having a pH greater than about 12.0.

5. The method of claim 4 wherein the etched component is treated using a free cyanide containing solution.

* * * * *